United States Patent [19]
Chaudhari et al.

[11] Patent Number: 5,863,869
[45] Date of Patent: *Jan. 26, 1999

[54] THIN FILM HIGH $T_C$ OXIDE SUPERCONDUCTORS AND METHOD FOR MAKING THE SAME

[75] Inventors: Praveen Chaudhari, Briarcliff Manor; Richard Joseph Gambino, Yorktown Heights; Roger Hilson Koch, Amawalk; James Andrew Lacey, Mahopac; Robert Benjamin Laibowitz, Peekskill; Joseph Michael Viggiano, Wappingers Falls, all of N.Y.

[73] Assignee: International Business Machines Corporation, Armonk, N.Y.

[*] Notice: The term of this patent shall not extend beyond the expiration date of Pat. No. 5,447,906.

[21] Appl. No.: 478,296

[22] Filed: Jun. 7, 1995

Related U.S. Application Data

[63] Continuation of Ser. No. 264,227, Jun. 23, 1994, Pat. No. 5,447,906, which is a continuation of Ser. No. 61,334, May 12, 1993, abandoned, which is a continuation of Ser. No. 436,851, Oct. 31, 1989, abandoned, which is a division of Ser. No. 27,584, Mar. 18, 1987, abandoned.

[51] Int. Cl.⁶ .................................. B32B 9/00; B05D 5/12
[52] U.S. Cl. .......................... 505/239; 505/220; 505/473; 505/500; 505/701; 505/732; 505/742; 428/930; 427/62
[58] Field of Search ...................... 505/691, 220, 505/239, 500, 473, 701, 732, 742; 428/930; 427/62, 63

[56] References Cited

PUBLICATIONS

C.W. Chu et al, Physical Review Letters, vol. 58, pp. 405–407 (26 Jan. 1987).

M.K. Wu et al, Physical Review Letters, vol. 58, pp. 908–910 (2 Mar. 1987).

R.H. Koch et al, Material Research Society, Spring Meeting 1987, Pittsburgh, Pa, pp. 81–84.

*Primary Examiner*—Roy V. King
*Attorney, Agent, or Firm*—Jackson E. Stanland; Daniel P. Morris

[57] ABSTRACT

Superconducting transition metal oxide films are provided which exhibit very high onsets of superconductivity and superconductivity at temperatures in excess of 40° K. These films are produced by vapor deposition processes using pure metal sources for the metals in the superconducting compositions, where the metals include multi-valent non-magnetic transition metals, rare earth elements and/or rare earth-like elements and alkaline earth elements. The substrate is exposed to oxygen during vapor deposition, and, after formation of the film, there is at least one annealing step in an oxygen ambient and slow cooling over several hours to room temperature. The substrates chosen are not critical as long as they are not adversely reactive with the superconducting oxide film. Transition metals include Cu, Ni, Ti and V, while the rare earth-like elements include Y, Sc and La. The alkaline earth elements include Ca, Ba and Sr.

49 Claims, No Drawings

THIN FILM HIGH $T_C$ OXIDE SUPERCONDUCTORS AND METHOD FOR MAKING THE SAME

This is a continuation of application Ser. No. 08/264,227, filed Jun. 23, 1994, now U.S. Pat. No. 5,447,906, which is a continuation of application Ser. No. 08/061,334 filed May 12, 1993, now abandoned, which is a continuation of Ser. No. 07/436,851 filed Oct. 31, 1989, now abandoned which is a division of Ser. No. 07/027,584 filed Mar. 18, 1987, now abandoned.

FIELD OF THE INVENTION

This invention relates to films of high $T_c$ oxide superconductors and methods for making them, and more particularly to such film structures and methods where the oxide superconductors exhibit superconductivity at temperatures greater than 40° K.

BACKGROUND ART

Superconductors of many types are known in the prior art, including both elemental metals and compounds of various types, such as oxides. The recent technical break-through reported by Bednorz and Mueller in Z. Phys. B, 64, 189 (1986) was the first major improvement in a superconducting material in the last decade, wherein the critical transition temperature $T_c$ at which the material becomes superconducting was increased substantially.

Bednorz and Mueller described copper oxide material including a rare earth element, or rare earth-like element, where the rare earth element could be substituted for by an alkaline earth element such as Ca, Ba or Sr.

The work of Bednorz and Mueller has led to intensive investigation in many laboratories in order to develop materials having still higher $T_c$. For the most part, these high $T_c$ oxide superconductors consist of compounds of La, Sr, Cu and O, or Y, Ba, Cu and O. In particular, copending application Ser. No. 024,653, filed Mar. 11, 1987 and assigned to the present assignee, describes a high $T_c$ oxide superconductor that is a single phase bulk superconductor having the general formula

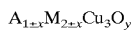

where A is Y or a combination of Y, La, Lu, Sc or Yb; M is Ba, or a combination of Ba, Sr or Ca; x is between 0 and 0.5 and y is sufficient to satisfy the valence demands of the material. A particularly preferred single phase composition described in that copending application is $Y Ba_2C_3O_y$.

For many applications, it is necessary to be able to provide the superconducting material in film form, i.e., in a range of thin films (for example, about 1000 angstroms) to thick films (for example, in excess of 1 micron). Heretofore, there has been no reported satisfactory way to provide films of these new high $T_c$ oxide superconductors where the films must exhibit superconductivity at temperatures in excess of 40° K. Accordingly, it is a primary object of the present invention to provide films of high $T_c$ oxide superconductors having superconductivity at temperatures in excess of 40° K, and methods for preparing these films.

It is another object of this invention to provide copper oxide superconducting films exhibiting superconductivity at temperatures in excess of 40° K, and methods for preparing these copper oxide high $T_c$ films.

It is another object of the present invention to provide transition metal oxide superconductive films having superconductivity at temperatures in excess of 40° K, and methods for preparing these transition metal superconducting oxides.

It is another object of the present invention to provide films of transition metal oxide superconductors exhibiting superconductivity at temperatures in excess of 40° K, where the films are continuous and smooth, and exhibit compositional uniformity over useable areas.

It is another object of the present invention to provide continuous, smooth copper oxide superconductive films exhibiting superconductivity at temperatures in excess of 40° K and methods for making these films, where the films exhibit perovskite-like structure.

It is another object of this invention to provide transition metal oxide superconductive films including a rare earth element, or rare earth-like element, where the films exhibit superconductivity at temperatures greater than 40° K, and methods for making these films.

It is another object of the present invention to provide films having the nominal composition $ABO_{3-y}$ or $ABO_y$ exhibiting superconductivity at temperatures greater than 40° K, where $\Lambda$ stands for a rare earth or near rare-earth element or a combination of a rare earth element and an element selected from the group consisting of Ca, Ba and Sr, B stands for a transition metal, and y is sufficient to satisfy the valence demands of the film composition.

It is another object of this invention to provide superconductive oxide films having the nominal composition $AB_2Cu_3O_{9-y}$, and methods for making these films, where the films are superconducting at temperatures in excess of 40° K and A is a rare earth or rare earth-like element, B is an alkaline earth element, and y is sufficient to satisfy valence demands of the composition.

It is another object of the present invention to provide smooth, continuous copper oxide superconducting films having a perovskite-like crystal structure and exhibiting superconductivity at temperatures in excess of 40° K, and to provide methods for making these films.

SUMMARY OF THE INVENTION

The films of this invention are oxide superconductors exhibiting superconductivity at temperatures in excess of 40° K, the films being smooth and continuous and exhibiting substantial compositional uniformity. In particular, the films are comprised of transition metal oxides containing a superconducting phase, and typically include a rare earth element or rare earth-like element. These rare earth-like elements include Y, Sc and La. Additionally, the rare earth or rare earth-like elements can be substituted for by an alkaline earth element selected from the group consisting of Ca, Ba, and Sr. The transition metals are multi-valent, non-magnetic elements selected from the group consisting of Cu, Ni, Ti, and V. Of these, Cu is preferred and provides unique superconducting films exhibiting essentially zero resistance at temperatures in excess of 77° K, the boiling point of liquid nitrogen. The copper oxide based films of this invention exhibit exceptionally high temperatures for the onset of superconductivity and have superconductivity at extremely elevated temperatures, in addition to being continuous, smooth, and of excellent compositional uniformity. The Cu oxide films are therefore considered to be unique examples of this class of films, as are the processes for making them.

Typically, the films are characterized by a perovskite-like crystalline structure, such as those described in more detail by C. Michel and B. Raveau in Revue Dde Chimie Minerale, 21, p. 407 (1984). These films are formed by a vapor deposition process in which multiple metal sources are used, pure metal being vaporized from each of these sources. Vapors of the pure metal travel to the substrate which is exposed to an oxygen ambient. A surface reaction occurs forming a metal oxide film on the substrate. In order to enhance this surface reaction, the substrates are usually heated. An annealing step in an oxygen environment is then carried out to satisfy valence and stoichiometry requirements. Afterwards, the annealed materials are slowly cooled to produce superconducting films.

The use of separate metal sources provides control of the process while the oxygen ambient during vapor transport is used to insure that the growing films are stable. The post-anneal step in an oxygen environment insures that sufficient oxygen is present to satisfy valence and stoichiometry requirements, as well as to obtain the proper phase for high $T_c$ superconductivity.

These and other objects, features, and advantages will be apparent from the following more particular description of the preferred embodiments.

DESCRIPTION OF THE PREFERRED EMBODIMENTS

As previously noted, this invention relates to transition metal oxides containing a superconducting phase that exhibits superconductivity at temperatures in excess of 40° K, and more particularly to films of these materials and to processes for making these films. The invention is specifically directed to films which are superconducting at temperatures in excess of 40° K, the designation "high $T_c$" films being used to indicate this property. In this manner, a distinction is clearly made between the films of this invention and the superconducting ceramic films known in the art, such as Ba—Pb—Bi—O films and Li—Ti—O films. These previously known films are also oxide superconductors, but have very low transition temperatures, typically below about 13° K. The Ba—Pb—Bi—O (BPB) composition is a perovskite-type oxide superconductor while Li—Ti—O (LTO) oxide superconductors are spinel-type oxides.

The preparation of BPB oxide films was first described by L. R. Gilbert et al in Thin Solid Films, 54, pp. 129–136, (1978). Those films were prepared by sputtering using mixed oxide targets produced by sintering and pressing together powders of barium, Bi, and lead oxides. Sputtered films were amorphous and became metallic and superconducting (in most cases) upon annealing. Films were annealed both in air and in oxygen. A defect model based on barium vacancies and an equal number of oxygen vacancies was postulated for the superconducting behavior of these films.

In a subsequent article L. R. Gilbert et al described resputtering effects in the BPB perovskites. This article is L. R. Gilbert et al, J. Vac. Sci. Technol., 17 (1), p. 389, Jan./Feb. 1980.

Subsequent to the work of Gilbert et al, M. Suzuki and coworkers further developed techniques for forming films of BPB. In their work, they produced superconducting thin films using high partial pressures of oxygen in their sputtering apparatus, where the sputtering targets were dense mixtures of Ba, Pb, and Bi oxides. Sputtering from pure metal targets was not suggested. A post-anneal step in an oxygen environment was used to obtain superconducting films having a perovskite-type structure. Both cooled and heated substrates were utilized. These processing conditions of Suzuki et al are described in the following references:

1. M. Suzuki et al, Japanese Journal of Applied Physics, Vol. 19, No. 5, pp. 1231–1234, May 1980.
2. M. Suzuki, J. Appl. Phys., 53 (3), p. 1622, March 1982.

In addition to the processing techniques developed by Suzuki et al to provide films of these oxide superconductors, their research has been extended to the utilization of the superconducting oxide films in devices, such as tunnel junctions. References generally describing the devices and their characteristics are the following:

1. A four-page article by Toshiaki Murakami, Minoru Suzuki, and Youichi Enomota entitled "New Devices Using Superconducting Ba $Pb_{0.7}Bi_{0.3}O_3$(BPB) Thin Films"
2. M. Suzuki et al, Japanese Journal of Applied Physics, Vol. 21, No. 7, p. 1437, July 1982.
3. M. Suzuki et al, Proceedings of the 13th Conference on Solid State Devices, Tokyo, 1981; Japanese Journal of Applied Physics, Vol. 21, (1982) Supplement 21-1, pp. 313–318.

Reference 3 describes Josephson Tunnel Devices fabricated from both BPB and LTO thin films.

In order to illustrate the process of the present invention, several examples will be given, followed by a discussion of the various processing steps.

EXAMPLES

Y—Ba copper-oxide superconductive films were produced having high $T_c$. Compositions having the nominal composition $YBaCu_2O_4$ and $YBa_2Cu_3O_y$ were formed. The value of y is chosen to provide satisfaction of the valence and stoichiometry requirements of the composition and can be, for instance, y=8.

A vacuum deposition system was used, having three 10 kV electron beam heated sources. The deposition rates could be controlled over the range of 0.1–1 nm/sec, and substrate temperature could be varied from −100° to 700° C. The substrate composition can vary, and generally consisted of sapphire wafers commercially available with both c and a-axis orientation. Plates of MgO were also used as substrates, both with <110> and <001> orientations. In general, only small differences were found in the final films among the above-mentioned substrates.

The three electron guns were filled with the desired three metals, Y, Ba, Cu, and the evaporation rates were adjusted to give the nominal desired composition at the substrate plane. It was initially found that films made at room temperature in a high vacuum were often unstable upon removal to room ambient and generally were not superconducting. In order to avoid the deterioration of the films and to obtain stable films at room ambient, the films were deposited in a partial pressure of oxygen with a pressure up to $10^{-3}$ torr. The substrate temperatures were elevated typically to about 450° C. Films between 0.1 and 1 micron were grown.

The ac resistance versus temperature data for these films were taken using four terminal pressure contacts while susceptibility measurements were made using a SQUID magnetometer. The applied current was kept small during the resistance versus temperature measurements, typically around 1 microamp, while smaller currents were also used. These films showed a strong Meissner effect. The as-deposited films were dark end of high resistance. These as-deposited films did not generally go superconducting. When annealed at high temperature (about 900° C.) in oxygen, the films became metallic and generally were superconducting.

Chemical analysis confirmed that the composition of the films was within about 15% of the aimed-for value. The exact composition is not necessary to see high $T_c$ superconductivity, a result which is in agreement with work on bulk materials of these types. Some variation over the plane of the substrates was also observed. Knowledge of the chemical composition proved to be of great value in adjusting vapor deposition rates, substrate temperature and background pressure.

The Y-based films exhibited high $T_c$ behavior. For example, a film of composition $$Y_{0.75}Ba_{1.35}Cu_3O_{7.7}$$

experienced an onset of superconductivity at about 97° K and superconducting behavior at about 50° K. There was some microscopic evidence for the existence of a second phase in these films. The films have a nearly complete Meissner effect showing a susceptibility of about 0.5 of ¼ π.

Additional Y—Ba films were grown having an onset of superconductivity at about 97° K and exhibiting superconductivity at temperatures in excess of 77° K. These films had a nominal composition $Y_{0.87}Ba_{158}Cu_3O_{9-y}$ Example The process of this invention can also be applied to other high $T_c$ oxide superconductors. For example, films containing La, Sr, Cu and O can be obtained by this technique. In this case, the three electron guns are filled with La, Sr, and Cu. The general steps of the process are then the same as those described with respect to the proceeding example except that there are some variations in the annealing steps. These variations will be described in the following discussion.

DISCUSSION OF PROCESS STEPS

A key feature of the present process uses vapor streams of the metals to be utilized in the film. Substantially pure metal sources are used, rather than oxide sources which previously have been used to sputter low $T_c$ oxide superconductors (see Suzuki et al, above). Codeposition of these three metals occurs onto a heated substrate, there being an oxygen ambient so that oxygen will simultaneously arrive at the substrate for a surface reaction to form the oxide film. Those of skill in the art will recognize that other techniques can be used to provide the necessary oxygen ambient (e.g. an oxygen ion beam, a jet of oxygen, etc.)

In applicants' experimentation, it has been found necessary to provide oxygen in order to stabilize the growing films. Without the oxygen ambient, the films were unstable upon removal to room ambient and generally were not superconducting. They were not uniform in appearance or deposition as confirmed by x-ray data. However, some of the proper structure was present in the films. Consequently, in order to avoid deterioration of the films and to obtain stable films at room ambient, a partial oxygen pressure was used.

Generally, high temperatures are required to provide the perovskite phases necessary to obtain superconductivity. For example, for bulk materials a sintering step in excess of about 900° C. is required. However, such temperatures cannot be used when pure metals are vapor deposited, as many of these pure metals have melting points which are less than these high temperatures. This is particularly true for the alkaline earth elements. Thus, in a vacuum environment these metals would boil off, leading to excess deficiencies of the metals in the growing film. Typically, in order to obtain the proper phase high temperatures are required but such high temperatures cannot be used in the film deposition apparatus. Therefore, complete in-situ oxidation is not readily obtained and, for this reason, subsequent annealing steps are used. These annealing steps are tailored in accordance with the composition of the film that is grown and the amount of oxygen incorporated into the growing film. Typically, the annealing step is used to insure that a proper amount of oxygen is present and/or to obtain the right phase for superconductivity.

For example, a 2-step anneal is used for superconducting oxides containing La and Sr. For these films, a first anneal at about 400° C. in a pure oxygen environment is used. This anneal is for approximately 6–30 minutes. It is then followed by a second annealing step at about 700° C. in pure oxygen, again for about 6–30 minutes. The first low temperature anneal adds oxygen to the film, while the second higher temperature anneal is used to produce the proper phase for superconductivity. In these La—Sr films, if the annealing temperature is greater than about 500° C., the films will start to lose oxygen. However, an anneal at temperatures greater than this is necessary to provide the proper perovskite phase for superconductivity. Therefore, a two-step approach is used where the first annealing step at about 400° C. enables additional oxygen to be incorporated while the second annealing step at about 700° C. allows the formation of the proper superconducting phase, even though some oxygen will be lost.

Y—Ba films, as deposited, exhibit characteristics between insulating and metal properties. Their room temperature resistance is in the megohm range for films typically about 4000 angstroms. Thus, an intermediate annealing step is not required since these films contain enough oxygen, in contrast with as-deposited La—Sr films which have a room temperature resistance of only about 5–10 ohms. Y—Ba films can be annealed directly at high temperature (about 900° C.) in an oxygen atmosphere for a few minutes. They are then slowly cooled (about 3 hours) to room temperature.

In an alternative step, the Y—Ba films are first heated to about 900° C. in a 100% He atmosphere. The presence of He performs mixing in order to eliminate compositional non-uniformities which may be present in the film, which makes the films more homogeneous. This is followed by an anneal in 100% oxygen for a few minutes at about 900° C.

As noted above, the cooling step after annealing is generally done slowly over a period of several hours to room temperature. It appears to be particularly important to provide very slow cooling over the first few hundred degrees. During this cooling, the oxygen atmosphere can be maintained.

It has been noted that substrate heating appears to be important in order to provide good control of the relative amounts of the metal in the high $T_c$ superconductors of this invention. Generally the ratio of the rare earth element/alkaline earth element must be controlled reasonably well. For example, the ratio La:Sr is usually about 1.8:0.2. However, it is difficult to control alkaline earth elements as a vapor transporting species since they tend not to have a constant transport rate. In order to compensate for this, the substrate temperature is elevated. Generally, it is believed that the substrate temperature can be controlled to obtain the necessary reaction between the depositing metals and oxygen at the substrate. Epitaxy may be possible with the correction combinations of substrate temperature, metal transport rates, etc.

It has been observed that the substrate temperature during co-deposition of the metals comprising the superconducting oxide films can determine the relative amounts of these metals in the film. Rather than deposit on cooled or room temperature substrates, higher substrate temperatures were used. For example, at a substrate temperature 650° C. in an oxygen ambient pressure of $10^{-3}$T, the La:Sr ratio was 1.75:0.04. At a substrate temperature of 550° C. in the same oxygen ambient a ratio of 1.9:0.31 was obtained. Thus, the substrate temperature can be used to smooth out variations in the deposition rate of various metals and allows good control of the rare earth element:alkaline earth element ratio. The substrate temperature is convenient to control and quite precisely adjustable.

While several substrates have been mentioned, many others can be considered. Generally, it is preferable that the substrate be nonreactive with alkaline earth oxides of the type to be found in the superconducting films, since the alkaline earth materials are quite reactive. Refractory oxides are very favorable substrates, as are magnesium aluminum spinels, sapphire, and MgO. The particular orientation of the substrate does not appear to be critical. Further, the substrate need not have a planar, layer-like form, but can be in the shape of a wire or any type of irregular surface geometry, etc.

In the practice of this invention, films of transition metal superconducting oxide are formed exhibiting high $T_c$ and especially a $T_c$ in excess of liquid nitrogen temperatures. These films are characterized by the presence of a transition metal oxide and typically by the presence of a rare earth element and/or a rare earth-like element which can be substituted for by an alkaline earth. The transition metal element is a multi-valent nonmagnetic element while the alkaline earth element is selected from the group consisting of Ca, Ba, and Sr. The rare earth-like elements include Y, Sc, and La. The nonmagnetic transition metal is selected from the group consisting of Cu, Ni, Ti, and V. Of these, Cu is the most favorable, yielding film properties which are unique and unexpected.

In the further practice of this invention, it is to be understood that the term "film" broadly encompasses a layer, coating, etc. that is formed (deposited or grown) on a surface of any composition, shape, etc. These films have wide-spread applications in the electric and electronics industry, including uses as transmission and circuit lines, device electrodes, sensitive detectors of electromagnetic fields, and in various opto-electronic devices. Specific immediate uses include applications in high field magnets, electrochemical devices, Josephson tunnel devices, and interconnect metallurgy on and between chips in order to improve speed and packaging density in the microelectronics industry.

While the invention has been described with respect to particular embodiments thereof, it will be apparent to those of skill in the art that variations can be made therin without departing from the spirit and scope of the present invention.

Having thus described our invention what we claim as new and desire to secure as Letters Patent, is:

1. A multilayer structure exhibiting high superconducting $T_c$, comprising:
   a substrate,
   a film formed on said substrate, said film being a superconductive copper oxide having a superconducting transition temperature $T_c$ in excess of 70° K and exhibiting superconductivity at temperatures in excess of 40° K, said films also including a rare earth or rare earth-like element selected from the group consisting of a lathande element, Y, $S_c$, and La that is at least partially substituted by an alkaline earth element, said films being continuous and smooth and having therein a superconducting cooper oxide phase said substrate being a material which does not react with said film to adversely affect the superconductive properties of said film.

2. The structure of claim 1, where said film has a thickness less than about 10,000 angstroms.

3. The structure of claim 1, where the ratio of the rare earth element and alkaline rare earth element to cooper is approximately 1:1.

4. The structure of claim 1, where the superconducting film contains a rare earth-like element selected from the group consisting of Y, Sc, and La.

5. The structure of claim 1, where said superconducting film exhibits a perovskite-like crystallographic structure.

6. The structure of claim 1, where said superconductive film contains Y, and Ba.

7. The structure of claim 6, wherein the ratio (Y, Ba):Cu is approximately 1:1.

8. The structure of claim 7, wherein said superconducting film has a nominal composition

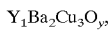

$Y_1Ba_2Cu_3O_y$, where y is sufficient to satisfy the valence and stoichiometry demands of the material.

9. A superconducting structure comprising, in combination:
   a substrate,
   a film of superconductive material formed on said substrate said substrate being nonreactive with said superconductive film, said superconductive film being a crystalline film exhibiting superconductivity film being a crystalline film exhibiting superconductivity at temperatures in excess of 40° K, said film being continuous and being comprised of a copper oxide having a phase exhibiting superconductivity and further including at least one rare earth element or rare earth-like element selected from the group consisting of Y, Sc, and La, said films having an alkaline earth substitution for said rare earth or rare earth-like element.

10. The structure of claim 9, where said alkaline earth substitution is selected from the group consisting of Ca, Ba, and Sr.

11. The structure of claim 9, wherein said superconducting film has the properties of a superconducting onset temperature in excess of 90° K and a substantially zero resistive state at temperature in excess of 70° K.

12. The structure of claim 9, wherein said superconductive film includes an alkaline earth element selected from the group consisting of Ca, Ba, and Sr, said films exhibiting a perovskite-like crystalline structure.

13. The structure of claim 9, where said superconductive films contains La and Sr.

14. The structure of claim 9, where said superconductive film contains Y and Ba.

15. A superconducting structure, comprising in combination:
   a substrate
   a cooper oxide superconductive film deposited on said substrate, said substrate being substantially nonreactive with said film, said superconductive film exhibiting the onset of superconductivity at temperatures in excess of 90° K and further exhibiting a substantially zero resistance state at temperatures in excess of 90° K and further exhibiting a substantially zero resistance state at temperatures in exhibiting a perovskite-like crystalline structure.

16. A structure exhibiting a high superconductivity $T_c$, said structure including
- a substrate,
- a film formed on said substrate, said substrate being a material that is nonreactive with said film, said film being a superconductive copper oxide film having the property of substantially zero resistance at temperatures in excess of about 70° K and being comprised of a non-magnetic multi-valent transition metal oxide phase.

17. The structure of claim 16, where said film exhibits a crystalline perovskite-like structure.

18. The structure of claim 15, where said superconductive film includes an alkaline earth element, there being Cu—O planes in said film.

19. The structure of claim 18, where said substrate is an oxide.

20. The structure of claim 18, where said alkaline earth element is selected from the group consisting of Ca, Ba, and Sr.

21. The structure of claim 15, where said superconductive film is epitaxial with said substrate.

22. The substrate of claim 15, where said substrate is an oxide.

23. The structure of claim 15, where said substrate has a crystallographic structure substantially similar to that of said superconductive film.

24. A product including a superconductive layer interconnect line located between chips on a substrate and electrically joining said chip, said interconnect line product being formed by the process of:
- vapor transporting copper atoms and metal atoms comprising alkaline earth atoms to said substrate at a location joining said chips,
- providing an oxygen-containing ambient at said location while said copper atoms and said metal atoms are arriving at said substrate, said copper atoms and said oxygen ambient reacting to form a copper oxide layer at said location, said layer containing an alkaline earth element,
- annealing said layer in an oxygen containing environment, and
- cooling said annealed layer in an oxygen containing environment to produce a phase in said layer having superconducting properties at temperatures in excess of 77° K.

25. The product-by-process of claims 24, where said alkaline earth element is selected from the group consisting of Ca, Ba, and Sr.

26. The product-by-process of claim 24, where said annealing step occurs at a temperature in excess of about 700° C.

27. The product by process of claim 24, where said cooling occurs over several hours.

28. The product by process of claim 24, where said layer also includes a rare earth element.

29. The product by process of claim 24, where said substrate is heated during vapor transport of said copper atoms and said metal atoms to said substrate.

30. A superconductive oxide film-substrate product formed by the following process:
- vapor transporting copper and at least one other metal including an alkaline earth metal to a substrate for deposition thereon,
- providing an oxygen containing environment at said substrate during said vapor transporting step, said copper reacting with oxygen in said environment to form a copper oxide layer on said substrate, said copper oxide layer being mixed oxide also containing said one other metal,
- cooling said layer in an oxygen containing environment, said layer having a phase that exhibits superconducting properties at temperatures in excess of 77° K.

31. The product-by-process of claim 30, wherein said substrate is heated during vapor transport of said copper and said metal to said substrate.

32. The product-by-process of claim 30, where said metal is an element selected from the group consisting of alkaline earth elements consisting of Ca, Ba, and Sr.

33. The product-by-process of claim 30, where said substrate is a chip having electrical devices thereon, said deposited superconductive layer interconnecting devices on said chip.

34. The product-by-process of claim 30, where said superconductive layer further includes a rare earth or rare-earth-like element.

35. The product-by-process of claim 30, where said superconductive layer is characterized by copper-oxygen planes and a perovskite-like structure where the copper-oxygen planes carry supercurrents.

36. The product-by-process of claim 30, where said superconductive layer is characterized by copper-oxygen planes and a perovskite-like structure wherein the copper-oxygen planes carry supercurrents.

37. A superconductive structure, comprising in combination:
- a substrate,
- a superconductive film deposit on said substrate, said superconductive film and said substrate being substantially nonreactive with each other, said superconductive film exhibiting film a zero resistivity state at a temperature in excess of 70° K, said superconductive film being a continuous film and being comprised of a copper oxide having a crystalline structure.

38. The structure of claim 37, where said superconductive film contains an alkaline earth element.

39. The structure of claim 37, where said superconductive film contains a rare earth element or a rare earth-like element selected from the group consisting of Y, La and Sc.

40. The structure of claim 37, where said superconductive film contains Sr.

41. The structure of claim 37, where said superconductive film further includes a transition metal selected from the group consisting of Ni, Ti, and V.

42. The structure of claim 37, where said superconductive film includes V and Sr.

43. A superconductive structure comprising, in combination:
- a substrate,
- a film of superconductive material formed on said substrate, said superconductive film being a crystalline film exhibiting superconductivity at temperatures in excess of about 70° K, said superconductive film being continuous and comprised of a copper oxide having a phase exhibiting superconductivity above 70° K.

44. The structure of claim 43, where said superconductive film further includes a transition metal selected from the group consisting of Ni, Ti, and V.

45. The structure of claim 44, where said superconductive film also includes an alkaline earth element selected from the group consisting of Ca, Ba, and Sr.

46. A multilayer structure including, in combination:
a substrate,
a film formed on said substrate, said film being a crystalline superconductive copper oxide having a superconducting phase exhibiting a superconducting transition temperature in excess of 70° K, said copper oxide film also including an alkaline earth element.

47. The structure of claim 46, where said superconductive film has a thickness less than about 10,000 angstroms.

48. The structure of claim 46, where said alkaline earth element is selected from the group consisting of Ba, Ca, and Sr.

49. The structure of claim 46, where said superconductive film further includes a rare earth element or a rare earth-like element selected from the group consisting of Y, Sc, and La.

* * * * *